US012613316B2

(12) United States Patent
Davydenko et al.

(10) Patent No.: US 12,613,316 B2
(45) Date of Patent: Apr. 28, 2026

(54) LIGHT SOURCE FOR FREQUENCY-MODULATED CONTINUOUS WAVE (FMCW) LiDAR DEVICE

(71) Applicant: Scantinel Photonics GmbH, Ulm (DE)

(72) Inventors: Vladimir Davydenko, Bad Herrenalb (DE); Geert Jozef Ivo Morthier, Ghent (BE)

(73) Assignee: MicroVision, inc., Redmond, WA (US)

( * ) Notice: Subject to any disclaimer, the term of this patent is extended or adjusted under 35 U.S.C. 154(b) by 1123 days.

(21) Appl. No.: 17/534,047

(22) Filed: Nov. 23, 2021

(65) Prior Publication Data

US 2022/0334225 A1 Oct. 20, 2022

(30) Foreign Application Priority Data

Apr. 16, 2021 (EP) ..................................... 21168763

(51) Int. Cl.
| | |
|---|---|
| *G01S 7/48* | (2006.01) |
| *G01J 1/44* | (2006.01) |
| *G01S 7/481* | (2006.01) |
| *G01S 17/32* | (2020.01) |
| *G02F 1/01* | (2006.01) |

(Continued)

(52) U.S. Cl.
CPC .............. *G01S 7/4814* (2013.01); *G01J 1/44* (2013.01); *G01S 17/32* (2013.01); *G02F 1/0147* (2013.01); *G02F 1/212* (2021.01); *H01S 5/0085* (2013.01); *H01S 5/14* (2013.01); *G01J 2001/444* (2013.01); *G02F 2203/48* (2013.01)

(58) Field of Classification Search
CPC ........ G01S 7/4814; G01S 17/32; G02F 1/212; G02F 1/0147; G02F 2203/48; H01S 5/0085; H01S 5/14; G01J 2001/444
See application file for complete search history.

(56) References Cited

U.S. PATENT DOCUMENTS

| | | | | |
|---|---|---|---|---|
| 10,345,525 B2 * | 7/2019 | Doerr | ................... | G02B 6/3566 |
| 10,411,436 B2 * | 9/2019 | Brueck | ................ | H01S 5/0085 |

(Continued)

FOREIGN PATENT DOCUMENTS

| | | |
|---|---|---|
| CN | 103 487 881 A | 1/2014 |
| JP | 2011181789 A | 9/2011 |

OTHER PUBLICATIONS

Aditya Malik, Joel Guo, Minh A. Tran, Geza Kurczveil, Di Liang, and John E. Bowers, "Widely tunable, heterogeneously integrated quantum-dot O-band lasers on silicon," Photon. Res. 8, 1551-1557 (2020) (Year: 2020).*

(Continued)

*Primary Examiner* — Peter Radkowski
(74) *Attorney, Agent, or Firm* — Kevin D. Wills

(57) ABSTRACT

A light source for a frequency-modulated continuous-wave (FMCW) LiDAR device is formed by a photonic integrated circuit and comprises a substrate and a multilayer structure. Formed in the multilayer structure is a semiconductor laser that is received in a recess etched into the multilayer structure. An optical path between the semiconductor laser and a reflector forms an external cavity for the semiconductor laser. The external cavity includes a variable attenuator causing an attenuation of light guided in the cavity optical waveguide. The external cavity may also or alternatively include an optical phase modulator.

12 Claims, 4 Drawing Sheets

(51) Int. Cl.

| | |
|---|---|
| *G02F 1/21* | (2006.01) |
| *H01S 5/00* | (2006.01) |
| *H01S 5/14* | (2006.01) |

(56) References Cited

U.S. PATENT DOCUMENTS

| | | | | |
|---|---|---|---|---|
| 11,870,216 | B2 * | 1/2024 | Stern .................... | H01S 5/06837 |
| 2009/0135861 | A1 * | 5/2009 | Webster .................. | H01S 5/141 |
| | | | | 372/20 |
| 2014/0307753 | A1 * | 10/2014 | Minneman .............. | H01S 5/062 |
| | | | | 372/20 |
| 2018/0003899 | A1 * | 1/2018 | Doerr ................... | G02B 6/4225 |
| 2018/0366904 | A1 * | 12/2018 | Brueck ............... | H01S 5/02325 |
| 2019/0199062 | A1 * | 6/2019 | Ma ...................... | H01S 5/06821 |
| 2020/0259313 | A1 * | 8/2020 | Stern ................... | H01S 5/06837 |

OTHER PUBLICATIONS

Lee et al., "Demonstration of 12.2% wall plug efficiency in uncooled single mode external-cavity tunable Si/III-V hybrid laser," Opt. Express 23, 12079-12088 (2015) (Year: 2015).*

Lin et al., Vertical-coupled high-efficiency tunable III-V-CMOS SOI hybrid external-cavity laser, Opt. Express 21(26) 32425-32431 (2013) (Year: 2013).*

International Search Report and Written Opinion, PCT/EP2022/059615, Aug. 4, 2022, 12 pgs.

Extended European Search Report, EP Application No. 21168763.7, mailed Oct. 21, 2021.

Yingkai Lyu et al., "External Modulation Method for Generating Accurate Linear Optical Fmcw", IEEE Photonics Technology Letters, 29(18), pp. 1041-1135, Sep. 15, 2017.

B. Mroziewicz, "External cavity wavelength tunable semiconductor lasers—A Review", Opto-Electronics Review, 16(4), pp. 347-366, 2008, DOI: 10.2478/s11772-008-0045-9.

Danicl Nordin, Optical Frequency Modulated Continuous Wave (FMCW) Range and Velocity Measurements, PhD dissertation, Luleå University of Technology, Department of Computer Science and Electrical Engineering, Division of EISLAB, 2004, retrieved from http://urn.kb.se/resolve?urn=urn:nbn:se:ltu:diva-25907.

Scantinel Photonics GmbH, Korean Office Action, KR Patent Application No. 10-2023-7039303, Jul. 2, 2025, 13 pgs.

* cited by examiner

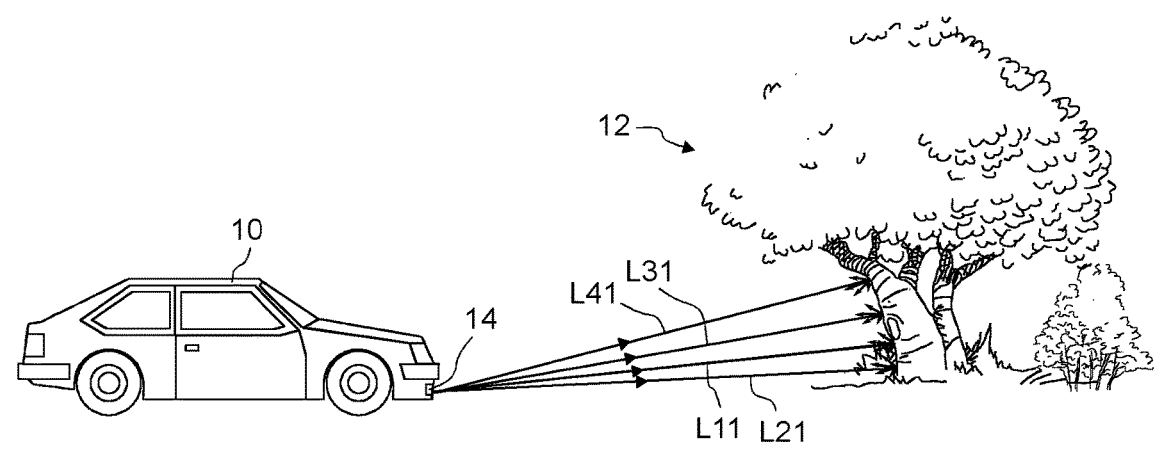
Fig. 1
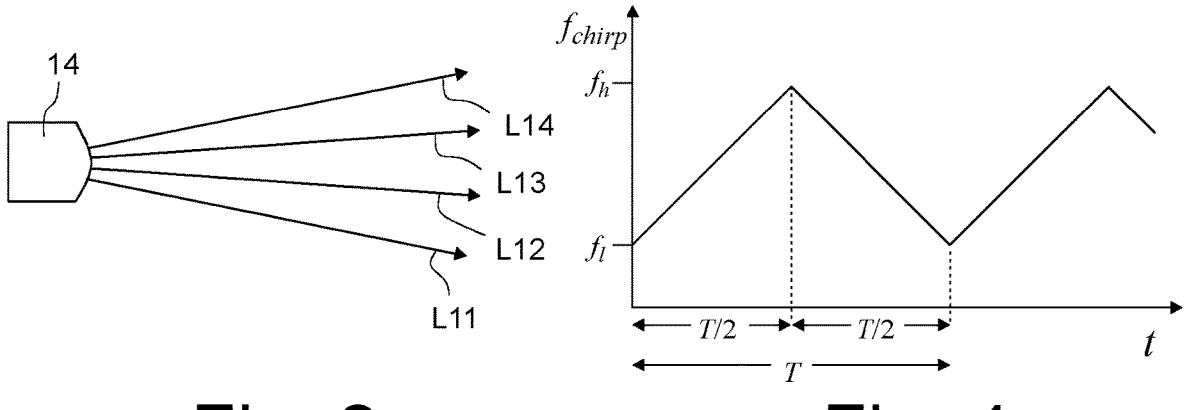
Fig. 2                    ## Fig. 4
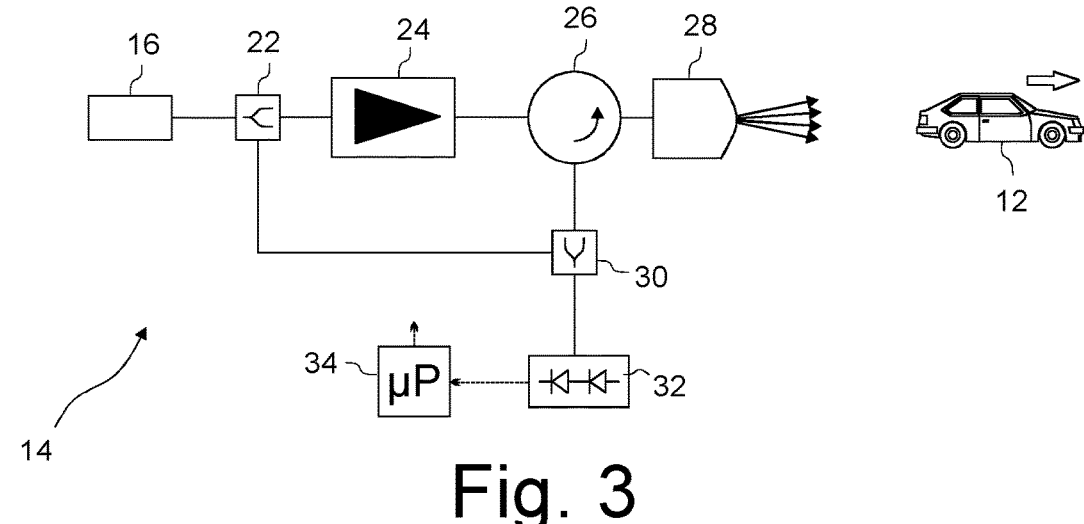
Fig. 3

LIGHT SOURCE FOR FREQUENCY-MODULATED CONTINUOUS WAVE (FMCW) LiDAR DEVICE

BACKGROUND OF THE INVENTION

1. Field of the Invention

The invention relates to light sources for FMCW Lidar devices that are used for range and/or velocity measurements relative to a moving or unmoving object. Such devices can be used, for example, in autonomously driving vehicles. The invention also relates to an FMCW LiDAR device comprising such a light source and to a method of calibrating such a light source.

2. Description of the Prior Art

Frequency-modulated continuous wave (FMCW) is a range and velocity measuring technology which was originally developed for RADAR applications. If light instead of radio waves are used, this technology is usually referred to as FMCW LiDAR, in which LiDAR is an acronym for "Light Detection And Ranging".

In FMCW LiDAR devices, frequency-modulated ("chirped") light beams scan the environment. A small fraction of the light is diffusely reflected at the object, received by the device and superimposed with a local oscillator wave. The frequency difference between the two signals, which is usually referred to as beat frequency, is measured and used to compute the range R of the object. It is also possible to compute the radial relative velocity v based on the Doppler frequency shift that is observed in the present of a relative velocity. By using a tunable laser as light source and a photodiode as detector, the beat frequency can be extracted directly from the photodiode current, because the photodiode delivers a current that is proportional to the squared sum of the two optical waves ("self-mixing effect").

Obtaining 3D images by scanning an FMCW light beam over the object is usually accomplished using Galvano mirrors or similar bulky and sensitive optics. However, in certain applications, and in particular in the field of autonomous driving, FMCW LiDAR devices have to be small, robust, cheap and extremely reliable. It has therefore been proposed to realize such devices as photonic integrated circuits (PICs) having no—or at most very few—movable parts.

The accuracy of the distance and velocity measurement depends, among other, on the spectral linewidth of the light source, the modulation frequency span $\Delta f$ and the linearity of the frequency sweep. This places high requirements on the light source.

Usual DFB or DBR diode lasers having a suitable operating wavelength (preferably outside the visible light spectral window) typically have a linewidth of a few MHz. Usually, due to the semiconductor's inherent broad gain spectrum, more than one mode will operate simultaneously, resulting in multiple output wavelengths and a broad linewidth. However, for achieving the accuracy required in autonomous driving and similar applications, a line-width in the MHz range is too large. What is required is a reduction by about three orders of magnitude, i.e. a linewidth in the kHz range.

One approach for producing light having a narrow bandwidth with a linear sweep frequency modulation is to perform single sideband (SSB) modulation. The output of a CW laser is intensity modulated by an extra-cavity modulator that is driven by a linearly swept electrical signal from a waveform generator, for example an AWG. See, Lyu, Yingkai & Yang, Tianxin & lu, Zhaoyu & Cheng, Guo & Ge, Chunfeng & Wang, Zhaoying & Jia, Dongfang & Yin, Huabing. (2017). *External Modulation Method for Generating Accurate Linear Optical FMCW.* IEEE Photonics Technology Letters. PP. 1-1. 10.1109/LPT.2017.2736561. One disadvantage of this approach is the need for complex electronic drivers that produce a current modulation in the GHz range.

It is also known in the art to reduce the linewidth by placing the laser in an external cavity comprising a wavelength selector. The external cavity extends the laser cavity and comprises a reflector that is typically used as wavelength selector. If placed in the external cavity, the laser can be forced to operate in a single longitudinal mode. This approach is described in detail in Mroziewicz, Bohdan. (2008). *External cavity wavelength tunable semiconductor lasers—A review.* Opto-Electronics Review. 16. 347-366. 10.2478/s11772-008-0045-9. Different types of reflectors are described and discussed in this paper.

Using external cavity lasers as light source in a FMCW LiDAR light source has also been proposed, see D. Nordin, *Optical frequency modulated continuous wave (FMCW) range and velocity measurements*, PhD dissertation, Lulea, 2004, retrieved from http://urn.kb.se/resolve?urn=urn:nbn:se:ltu:diva-25907. In this paper, the reflector is formed by a fiber Bragg grating.

However, it is difficult to implement a light source comprising an external cavity laser as a photonic integrated circuit. It turns out that the linewidth, and thus the accuracy of the FMCW device comprising the light source, varies considerably from one device to another.

SUMMARY OF THE INVENTION

It is therefore an object of the present invention to provide a light source for an FMCW LiDAR device. The light source shall be realized as an photonic integrated circuit and shall have a very small linewidth, but should allow a high production yield.

This object is achieved, according to the invention, by a light source for an FMCW LiDAR device, wherein the light source is formed by a photonic integrated circuit. The light source comprises a substrate and a multilayer structure supported by the substrate. At least the following functional elements are formed by the multilayer structure:

an input optical waveguide, an output optical waveguide and a cavity optical waveguide, an optical splitter connecting the input optical waveguide both to the output optical waveguide and to the cavity optical waveguide, a reflector connected to the cavity optical waveguide, a variable attenuator causing an attenuation of light guided in the cavity optical waveguide, a semiconductor laser that is received in a recess etched into the multilayer structure and connected to the input optical waveguide such than an optical path extending between the semiconductor laser and the reflector and including the optical splitter forms an external cavity for the semiconductor laser, a first electrical line connected to the semiconductor laser so as to supply the semiconductor laser with a varying operating current, wherein the semiconductor laser is configured to produce light having a frequency that varies synchronously with the supplied operating current, and a second electrical line connected to the variable attenuator so that the attenuation caused by the attenuator depends on electrical signals that are supplied to the variable attenuator via the second electrical line.

The invention is based on the perception that the intensity of the light reflected in the external cavity and entering the internal laser cavity is a crucial parameter for a stable and successful reduction of the laser's linewidth. Only if this intensity is within a narrow range of allowable values, the required small linewidth can be obtained.

In minute photonic integrated circuits (PICs), the intensity of this light cannot be easily controlled by design only. It has turned out that manufacturing tolerances make it impossible to reliably keep the intensity of the light entering the internal laser cavity within the desired range. If no additional measures are taken, only a small fraction of manufactured PIC light sources would have the desired small linewidth. However, a low production yield jeopardizes the goal of producing cheap LiDAR devices.

The invention solves this problem by using a variable attenuator that causes an attenuation of light guided in the cavity optical waveguide. It is thus possible to control the intensity of the light which is fed from the external cavity into the internal cavity of the semiconductor laser.

The variable attenuator can be part of a closed-loop control that continuously supervises the intensity in the cavity waveguide so as to keep the linewidth within the desired range. To this end, the light source may comprises a monitor unit that spectrally analyzes the output of the semiconductor laser and feeds the measurement data back to the closed-loop control.

However, it has turned out that even in demanding applications such as autonomous driving with their strongly changing ambient conditions, variations of the linewidth during normal operation of the light source are small and can usually be tolerated. In other words, the problem are manufacturing tolerances, not changing ambient conditions during operation of the LiDAR device. For that reason, a closed-loop control during normal operation of the light source can often be dispensed with.

In most cases, it suffices to use the variable attenuator to calibrate the PIC light source after its production, but before shipping. Such a calibration scheme may comprise the following steps:

a) providing the light source;

b) producing an operating current for the light source, wherein the operating current has a magnitude that linearly increases or decreases during measuring intervals;

c) measuring a frequency characteristic of the light produced by the semiconductor laser;

d) comparing the frequency characteristic measured in step c) with a target frequency characteristic;

e) determining an attenuation to be caused by the attenuator on the basis of the comparison of step d).

Since a variable PIC attenuator cannot be set by using adjustment screws or the like, the setting is performed by supplying electrical signals to the variable attenuator via the second electrical line.

The nature of these signals depends on the type of attenuator that is used. One approach for realizing a tunable attenuator is to use the reflector of the external cavity for this purpose. For example, Bragg reflectors have been proposed in the art that are thermally tunable so that the peak reflectivity shifts to other wavelengths. However, this wavelength sensitivity is not desired in the context of the FMCW light sources with their broach frequency sweep. Using such a Bragg reflector as tunable attenuator therefore requires a sophisticated control that changes the peak reflectivity concurrently with the wavelength chirp of the laser.

Another approach, which also uses an already existing component as tunable attenuator, would be to change the splitting ratio of the optical splitter. See, for example, Nilima Gogoi and Partha Pratim Sahu, *All-optical tunable power splitter based on a surface plasmonic two-mode interference waveguide*" Appl. Opt. 57, 2715-2719 (2018). The intensity of light coupled from the semiconductor laser into the external cavity and back from the external cavity into the semiconductor laser changes with application of varying optical pulse power. A drawback of this approach is that by changing the splitting ratio of the splitter, also the output power of the light source inevitably varies, which is generally undesirable.

In a preferred embodiment, the variable attenuator comprises a Mach-Zehnder interferometer comprising two arms, wherein one of the arms comprises a thermally tunable phase portion. By changing the phase relationship between the light guided in the two arms, the degree of destructive interference and thus the attenuation can be accurately set. In this manner a reduction of the intensity may be achieved that is in a range between −5 dB to −45 dB. Although this type of attenuator requires an additional component, it provides a simple, accurate and reliable means to control the intensity of the light guided in the cavity waveguide.

In another embodiment, the light source comprises a variable optical phase modulator acting on the cavity optical waveguide. The inventors have discovered that an optical phase modulator is generally beneficial, because it efficiently helps to suppress mode hopping while the laser frequency chirps.

Preferably the variable optical phase modulator is configured to change the phase of the light at a change rate that depends on a change rate of the frequency of the light produced by the semiconductor laser. However, usually it suffices if this condition is only approximately fulfilled. The provision of the optical phase modulator therefore does not require expensive electronic drivers.

In a preferred embodiment the variable optical phase modulator is thermally tunable. Such thermally tunable phase modulators are well known in the art and provide a simple and reliable means for phase control. A thermally tunable phase modulators may comprises a heating portion being part of the cavity optical waveguide and an electrical waveguide heater adjacent the heating portion. The electrical waveguide heater comprises an electrical conductive element configured to produce heat when exposed to an electrical heating current. The light source may then comprise a third electrical line connected to the waveguide heater so as to provide a heating current to the waveguide heater.

The cavity optical waveguide may include a delay section configured as a waveguide spiral. The geometrical length of the cavity optical waveguide is preferably between 5 mm and 100 mm, and more preferably between 8 and 12 mm. Using a waveguide spiral helps to reduce the outside dimensions of the final PIC.

The reflector may be realized as a broadband silicon distributed Bragg reflector. This ensures a uniform reflection over the entire laser chirp range. Alternatively, gratings or photonic wire loops may be used as reflector.

The semiconductor laser may be an InP DFB laser, for example. Optionally, DBR or VCSEL lasers may be used.

The preferred wavelengths are 905, 1060 or 1550 nm. The chirp range is typically between 0.2 to 150 GHz, and preferably between 1 to 5 GHz.

Subject of the invention is also an FMCW LiDAR device comprising a light source in accordance with the invention. Such a device may comprise an electronic control module connected to the first electric line and the second electric line. The electronic control module may be configured to vary the operating current supplied to the semiconductor via the first electrical line such that a magnitude of the current linearly increases or decreases during measuring intervals.

The electronic control module may be further configured to supply the variable attenuator with electrical signals so that the variable attenuator causes a constant attenuation that is determined on the basis of measurements of the performance of the light source.

If the light source comprises a variable optical phase modulator acting on the cavity optical waveguide, the electronic control module may be configured to control the optical phase modulator so as to produce a phase delay varying between 0 and $2\pi\Delta f\cdot\tau_{ext}$, wherein $\Delta f$ is a frequency range within which the frequency of the light produced by the semiconductor laser varies, and wherein $\tau_{ext}$ is a cavity roundtrip time required for the light to pass the optical path between the semiconductor laser and the reflector and back from the reflector to the semiconductor laser. If this condition is not fulfilled, mode hopping may occur that restricts the frequency range $\Delta f$ that is available for the chirp.

BRIEF DESCRIPTION OF THE DRAWINGS

Various features and advantages of the present invention may be more readily understood with reference to the following detailed description taken in conjunction with the accompanying drawings in which:

FIG. 1 is a schematic side view of a vehicle approaching an object which is detected by a scanner device;

FIG. 2 is a top view of the scanner device shown in FIG. 1;

FIG. 3 schematically shows the layout of a scanner device according to an embodiment of the invention;

FIG. 4 is a graph showing the time dependency of the frequency of a light source included in the scanner device;

DETAILED DESCRIPTION OF PREFERRED EMBODIMENTS

1. Introduction

Figure 5:
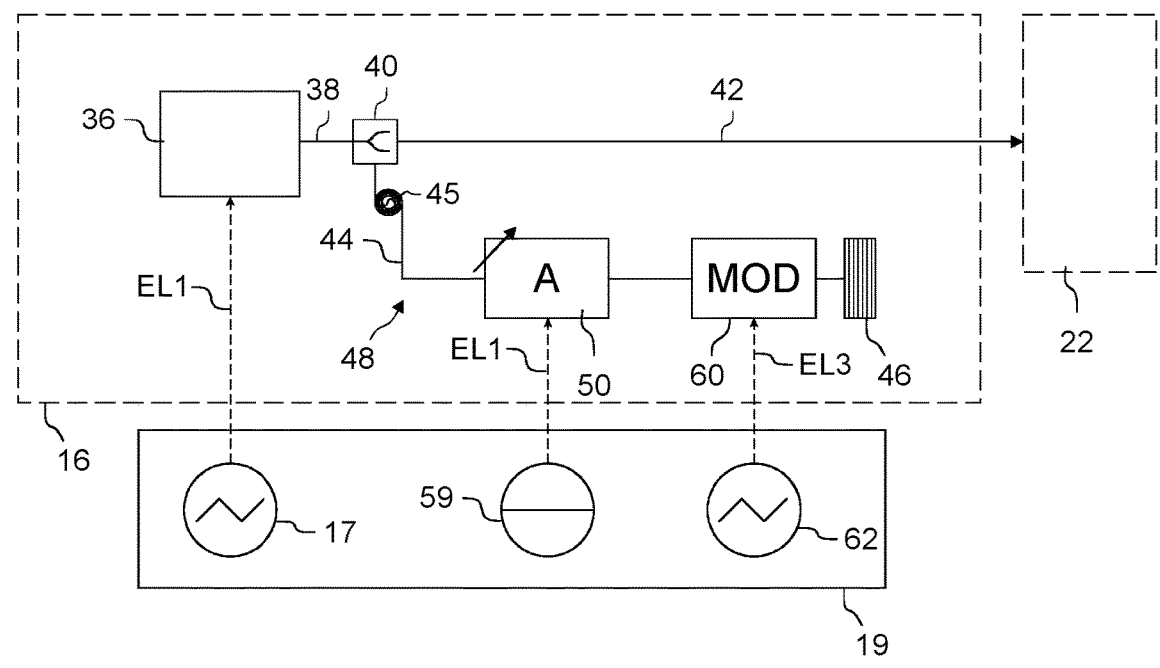
FIG. 5 is a schematic layout of the light source included in the scanner device.

FIG. 1 is a schematic side view showing a vehicle 10 that approaches an object 12 represented by a tree. The vehicle 10 has a scanner device 14 that scans the environment lying ahead of the vehicle 10 with light beams L11, L21, L31, and L41. From range information associated to each light beam, a three-dimensional image of the environment is computationally reconstructed. In addition, the scanner device 14 determines the relative velocity to the object 12. This information is particularly important if the object 12 is not fixed, but moves, too.

The information computed by the scanner device 14 about the environment lying ahead of the vehicle 10 may be used, for example, to assist the driver of the vehicle 10 in various ways. For example, warning messages may be generated if a collision of the vehicle 10 with the object 12 threatens. If the vehicle 10 drives autonomously, range and velocity information about the environment lying ahead are required by the algorithms that control the vehicle 10.

As is apparent in FIG. 1, the scanner device 14 emits the light beams L11 to L41 in different directions in a vertical plane (i.e. the plane of the paper in FIG. 1) so that the environment is scanned in the vertical direction. Scanning also takes place simultaneously in the horizontal direction, as FIG. 2 illustrates in a top view of the scanner device 14. Four light beams L11, L12, L13 and L14 are emitted in a horizontal plane in different directions.

Only for the sake of simplicity it is assumed in FIGS. 1 and 2 that only four light beams Ln1 to Ln4 are emitted vertically and horizontally. However, in real applications that scanner device 14 emits many more light beams. For example, $k\cdot 2^n$ light beams are preferred, wherein n is a natural number which is typically between 7 and 13 and specifies how many beams are emitted in one of k (horizontal or inclined) planes, wherein k is a natural number which is typically between 1 and 16.

2. Scanner Device

FIG. 3 schematically shows the layout of the scanner device 14 according to an embodiment of the invention. The scanner device 14 is configured as an FMCW LiDAR system and comprises a light source 16. During operation of the scanner device 14, the light source 16 produces light having a frequency $f_{chirp}$ that periodically varies ("chirps") between a lower frequency $f_l$ and a higher frequency $f_h$. The design of the light source will be described in more detail in the next section.

The graph of FIG. 4 shows how the frequency $f_{chirp}$ of the light source 16 varies over time t in this embodiment. Each measuring interval having a chirp duration T is divided into two halves of equal length T/2. During the first interval, the frequency $f_{chirp}$ increases linearly with a constant and positive up-chirp rate $r_{chirp}$, i.e. $df_{chirp}/dt=r_{chirp}$. The first interval is often referred to as up-chirp interval. During the second interval, the frequency $f_{chirp}$ decreases linearly with a constant negative down-chirp rate $-r_{chirp}$, i.e. $df_{chirp}/dt=-r_{chirp}$. This results in a triangular wave like frequency variation as shown in FIG. 4.

The light source 16 is connected to a splitter 22 that splits the measuring light into reference light (sometimes also referred to as "local oscillator") and output light. In this embodiment, the output light passes an optical amplifier 24 and an optical circulator 26 that guides the amplified output light towards a scanning unit 28. An optical circulator has three ports A, B and C and has the property that light entering one port leaves the next port. Therefore, light entering port A leaves port B, light entering port B leaves port C, and light entering port C leaves port A. For example, the optical circulator 26 may comprise a polarization sensitive beam splitter and a Faraday rotator that is arranged in the optical path upstream the scanning unit 28 so as to rotate the state of polarization by 45°, as this is known in the art as such. This ensures that output light from the amplifier 24 passes the beam splitter without being deviated, while the state of polarization of light reflected from the object 12 will undergo a rotation of 2.45° so that it is deviated by the polarization sensitive beam splitter.

Instead of using an amplifier 24 that amplifies only the output light, it is also possible, for example, to amplify the measuring light before it enters the splitter 22, to use at least one amplifier arranged in at least one light path between the light sources 16, 18 and the optical combiner 20, or to dispense with the amplifier 24 completely.

The scanning unit 28 directs the output light towards the object 12—in FIG. 3 represented by a moving car—along different directions, as it has been explained above with reference to FIGS. 1 and 2. While some part of each output light beam is usually absorbed by the object 12, another part is reflected. As long as the surface of the object 12 is not perfectly specular, diffuse reflection occurs which ensures that some output light is reflected at the object 12 such that it propagates back towards the scanning unit 28. The reflected output light, which is referred to in the following as input light, is received by the scanning unit 28 and guided towards the optical circulator 26.

The optical circulator 26 directs the input light towards a combiner 30 that combines the reference light, which was separated from the measuring light by the splitter 22, with the input light. A detector 32 arranged behind the further combiner 30 thus detects a superposition of the reference light and the input light. The detector 32 may be configured as a balanced detector, as this is known in the art as such. The electric signals produced by the detector 32 are fed to a computing unit 34 that computes the range R to the object and the relative velocity v between the scanner device 14 and the object 12 by analyzing beat frequencies resulting from the superposition detected by the detector 32.

Since no light has to be routed from the combiner 30 towards the splitter 22, using the optical circulator 26 is not mandatory. Often it suffices to use simpler polarization sensitive beam splitting elements instead of the optical circulator 26.

3. Light Source

FIG. 5 schematically shows the most important functional components of the light source 16. The latter comprises a semiconductor laser 36 that is connected, via a first electrical line EL1, to a laser driving unit 17 of an electronic control module 19. The laser driving unit 17 supplies the semiconductor laser 36 with a varying operating current so that the semiconductor laser 36 produces light having a frequency $f_{chirp}$ that varies synchronously with the varying operating current. Preferably, the operating current, and hence the frequency $f_{chirp}$ of the laser light, varies as shown in FIG. 4.

The semiconductor laser 36 has an output facet that is arranged adjacent to an input optical waveguide 38. Light produced by the semiconductor laser 36 couples into the input optical waveguide 38 and is guided to an optical splitter 40 that splits the light between an output optical waveguide 42 and a cavity optical waveguide 44. The optical splitter 40 has an asymmetric splitting ratio so that most of the light guided in the input optical waveguide 38 is guided to the output optical waveguide 42. For example, the splitting ratio of the optical splitter 40 may be between $10^{-3}$ to $10^{-7}$, and more preferably between $10^{-4}$ to $10^{-5}$.

In this embodiment, the output optical waveguide 42 is connected to the splitter 22 shown in FIG. 3. The output optical waveguide 42 thus connects the light source 16 to a light input of the remaining portion of the scanner device 14.

The cavity optical waveguide 44 may have a geometrical length of a several millimeters to a few centimeters. In order to reduce the overall dimensions of the light source 16, a portion of the cavity optical waveguide 44 may be formed as a waveguide spiral 45.

The cavity optical waveguide 44 terminates at a reflector 46. The portion of the light produced by the semiconductor laser 36 that is coupled into the cavity optical waveguide 44 returns, after being reflected at the reflector 46, on the same way towards the semiconductor laser 36 and enters its internal cavity. The optical path between the output facet of the semiconductor laser 36 and the reflector 46 thus forms an external cavity 48 for the semiconductor laser 36.

Figure 7:
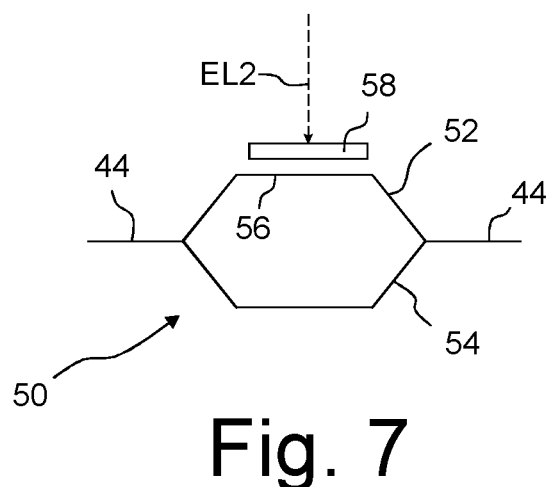
FIG. 7 is a schematic layout of a tunable attenuator included in an external cavity of the light source.

The external cavity 48 includes a variable attenuator 50 that causes an attenuation of the light guided in the cavity optical waveguide 44. FIG. 7 schematically shows a possible realization of the attenuator 50. In this embodiment, the attenuator 50 comprises a Mach-Zehnder interferometer (MZI) having a first arm 52 and a second arm 54. The first arm 52 comprises a thermally tunable phase portion 56 adjacent a heating element 58 that is connected, via a second electrical line EL2, to an attenuator driving unit 59 of the electrical control module 19. By changing the temperature dependent refractive index in the phase portion 56, the phase relationship between the light guided in the two arms 52 and 54 is modified. If the phase difference introduced by the phase portion 56 is k·2π, with k=0, 1, 2, . . . , the light guided in the two arms 52, 41 interferes constructively so that the attenuation becomes minimal. If the light guided in the two arms 52, 54 is completely out of phase, the strongest attenuation is achieved. In this manner, the attenuation can be accurately set by the magnitude of the heating current supplied via the second electrical line EL2.

The external cavity 48 further comprises a variable optical phase modulator 60 acting on the cavity optical waveguide 44. The optical phase modulator 60 changes the phase of the light at a change rate that depends on a change rate of the frequency of the light produced by the semiconductor laser 16. Preferably, the phase change is synchronized with the frequency change of the light. For example, if the frequency $f_{chirp}$ chirp changes as shown in FIG. 4, the phase change produced by the phase modulator 60 will be a triangular as well.

In the embodiment shown, the optical phase modulator 60 is thermally tunable. A third electrical line EL3 connects a waveguide heater of the optical phase modulator 60 to a modulator driving unit 62 of the electrical control module 19. In this manner the waveguide heater can be supplied with a varying heating current.

Figure 6:
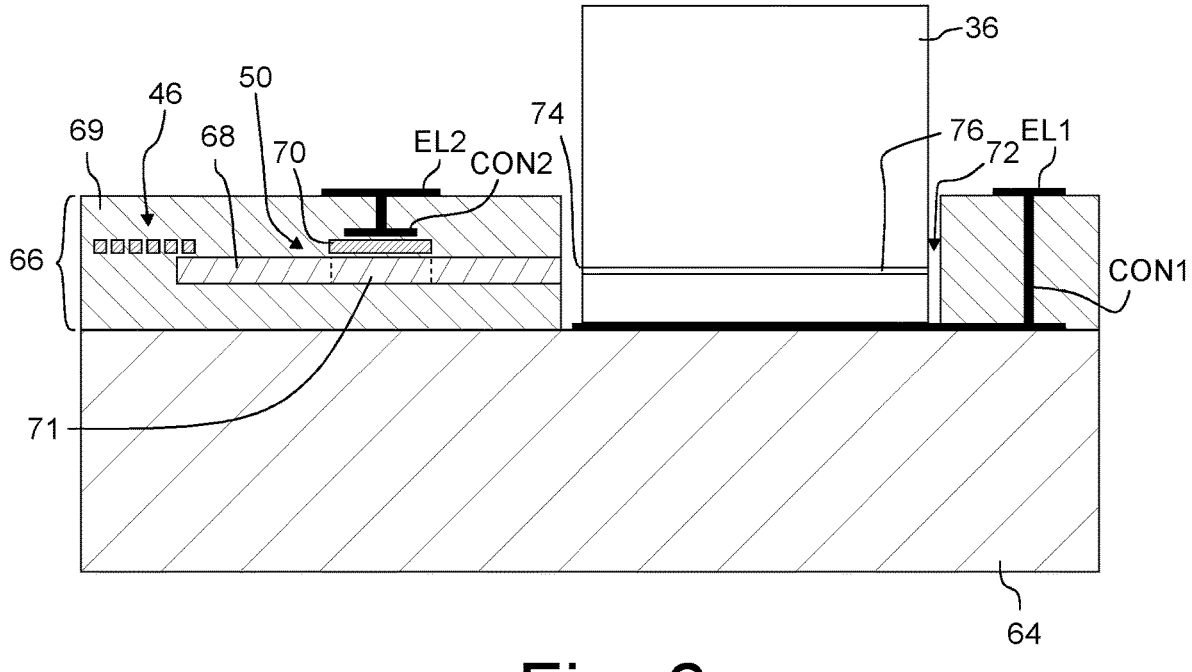
FIG. 6 is a schematic sectional side view of the light source realized as a photonic integrated circuit (PIC)

The light source 16 is realized as a photonic integrated circuit (PIC). FIG. 6 is a schematic sectional side view of the light source 16 showing some of the components that have been described above with reference to FIG. 5.

It can be seen that the light source 16 comprises in this embodiment a silicon substrate 64 supporting a multilayer structure 66 in which the aforementioned components are formed. In the embodiment shown, the multi-layer structure 66 comprises a structured waveguide layer 68 made from SiN that constitutes the cores of the optical waveguides 38, 42, 44 and of the splitter 44. Above the waveguide layer 68 is a structured silicon layer. One portion of this layer constitutes an electrical conductive element of the waveguide heater 70 that produces heat when an electrical heating current is supplied. The waveguide heater 70 is arranged adjacent to a heating portion 71 of the cavity optical waveguide 44. The waveguide heater 70 is connected, via a contact structure CON2, to the second electrical line EL2.

A second portion of the structured silicon layer constitutes the broadband silicon distributed Bragg reflector 46.

The multilayer-structure 66 further comprises a silicon oxide layer 69 in which the waveguide layer 68 and the structured silicon layer are embedded.

The semiconductor laser 36 is received in a recess 72 etched into the multilayer structure 66. A sophisticated ultra-high accuracy flip-chip bonding process is used to attach the semiconductor laser 36 to the ground of the recess 72. This process is described, for example, in M. Theurer et al., "Flip-Chip Integration of InP to SiN Photonic Integrated Circuits," in Journal of Lightwave Technology, vol. 38, no. 9, pp. 2630-2636, 1 May 1, 2020, doi: 10.1109/JLT.2020.2972065. The semiconductor laser 36 is connected via a further contact structure CON1 to the first electrical line EL1.

Light emitted from the output facet 74 is coupled into the input optical waveguide 38 formed by a portion of the structured SiN waveguide layer 68, enters the cavity optical waveguide 44 via optical splitter 40, passes the attenuator 50 (splitter 40 and attenuator 50 are both arranged outside the sectional plane of FIG. 6 and are therefore not shown) and the optical phase modulator 60, is reflected at the distributed Bragg reflector 46 and returns to the internal cavity 76 of the semiconductor laser 36 on the same optical path.

The electronic control module 19 shown in FIG. 5 may be directly formed on the substrate 64 or may be a separate component. The same also applies to the remaining components of the scanner device 14.

4. Function a) Amplitude control

Figure 8:
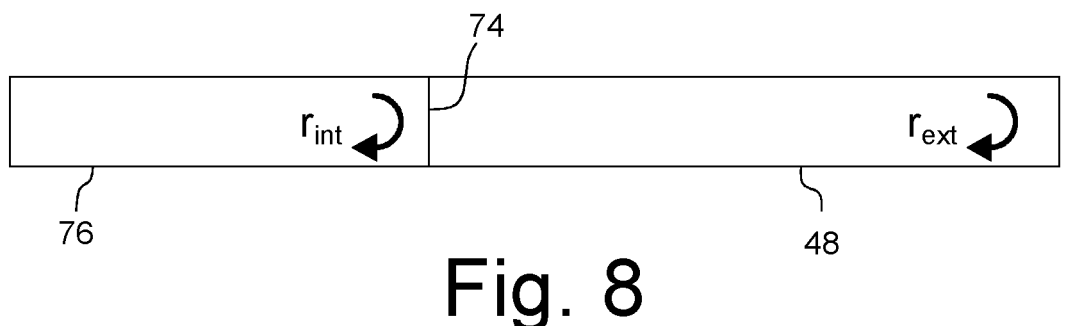
FIG. 8 is a schematic illustration showing reflectances of the internal and the external cavity of the light source.

FIG. 8 schematically shows the internal cavity 76 of the semiconductor laser 36 and the external cavity 48. The output facet 74 of the semiconductor laser 36 has a reflectance $r_{int}$, and the reflector 46 of the external cavity 48 has a reflectance $r_{ext}$. In order to make sure that the desired linewidth narrowing is accomplished, the percentage of the light intensity that is reflected back from the external cavity 48 into the internal cavity 76 must be in a certain range, e.g. around −30 dB, which corresponds to 0.1%. This percentage depends mainly on the splitting ratio of the splitter 40, the reflectance of the reflector 46, the insertion loss of the cavity optical waveguide 44, and of course on the attenuation caused by the attenuator 50.

Figure 9:
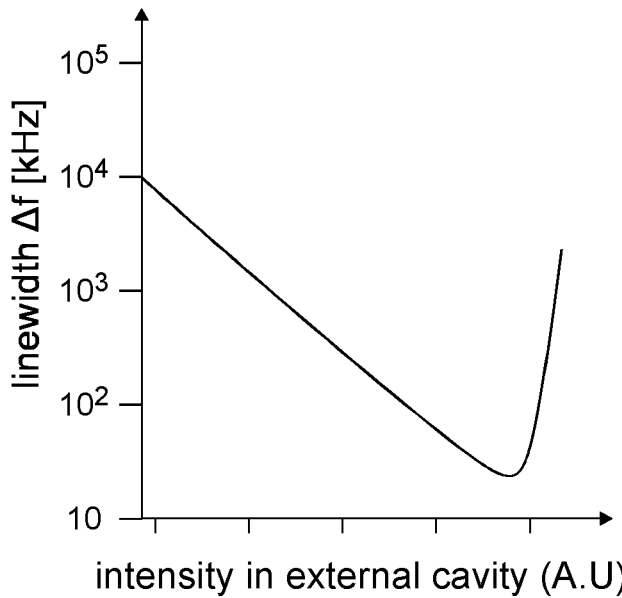
FIG. 9 is a graph illustrating how the linewidth depends on the intensity in the external cavity.

FIG. 9 is a graph illustrating how the linewidth $\Delta f$ depends on the intensity in the external cavity 48. It can be seen that there is a sharp minimum at a certain intensity. If the intensity significantly deviates from this value, the linewidth strongly increases. Therefore it is important that the light guided in the external cavity 48 has an amplitude (or intensity) within a small range.

The variable attenuator 50 ensures that the amplitude of the light in the external cavity 48 is within this range irrespective of manufacturing tolerances. To this end, the variable attenuator 50 may be used to calibrate the light source 16 after it has been manufactured, but before shipping. During calibration, the light source 16 is connected to a current supply so that it produces the desired frequency chirp. The linewidth of the laser output is measured and compared to the specifications of a target linewidth. If the measured linewidth is outside the specifications, the current supplied to the attenuator 50 is varied until the linewidth of the laser output is within the specifications.

b) Cavity Length

Figure 10:
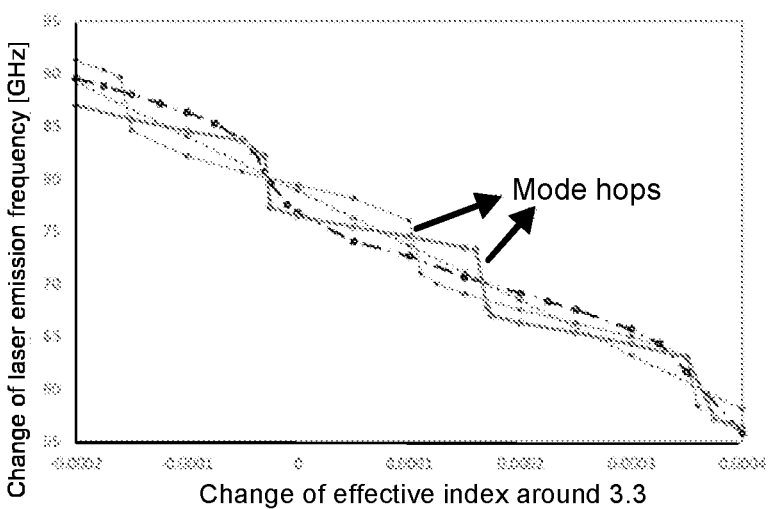
FIG. 10 is a graph illustrating the suppression of mode hops in the presence of an optical phase modulator in the external cavity.

The optical path length in the external cavity 48 must be large enough, e.g. several millimeters to a few centimeters. As an example, we consider a 300 μm long DFB laser coupled to an external cavity 48 having a −30 dB reflection. FIG. 10 shows how the emission frequency of the light source 16 changes if the effective refractive index of the laser changes, for example as a result of a changing ambient temperature. The three different curves represent three different lengths of the external cavity 48, namely 5 mm (dotted dashed line), 7.5 mm (thin full line) and 10 mm (thick full line). The emission frequency change of the semiconductor laser 36 without an external cavity 48 is given by the dotted line.

One can see that mode hops occur, i.e. sudden drops of the emission frequency. The light source 16 can only be tuned in a tuning range that is free of mode hops. Mode hops therefor restrict the available frequency range and thus the accuracy of the scanner device 14. From FIG. 10, it becomes apparent that the mode hop free tuning range is smaller as the length of the external cavity 48 becomes larger. For example, the mode hop free tuning range is reduced to 4 GHz for the external cavity length of 10 mm.

c) Phase Control

It can be shown theoretically that the reflection in the external cavity 48 considerably limits the mode hop free tuning range when the semiconductor laser 36 is tuned in an FMCW scanner device 14. To overcome this problem, the optical phase modulator 60 produces a phase delay varying between 0 and $2\pi\Delta f \cdot \tau_{ext}$, wherein $\Delta f = f_h - f_l$ is the frequency range within which the frequency of the light produced by the semiconductor 36 laser varies (see FIG. 4), and wherein $\tau_{ext}$ is a cavity roundtrip time required for the light to pass the optical path between the semiconductor laser 36 and the reflector 46 and back from the reflector 46 to the semiconductor laser 36. This implies that the optical phase modulator 60 should be able to vary the phase for a single pass by $\pi\Delta f \cdot \tau_{ext}$. With such phase variations, one can obtain the desired mode hop free tuning range and simultaneously maximum linewidth reduction.

Figure 11:
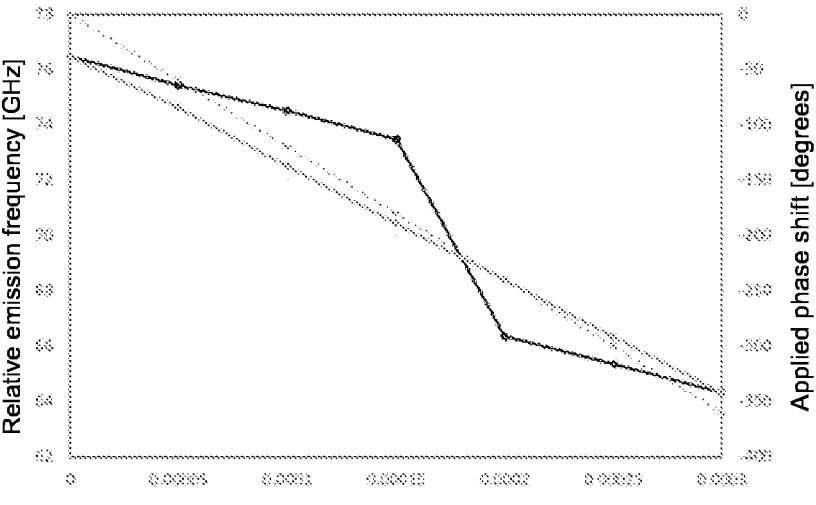
FIG. 11 is a graph illustrating the emission frequency change with and without an optical phase modulator in the external cavity.

The effect of the optical phase modulator 60 is illustrated in FIG. 11, which shows the emission frequency change of the light source 16 without and with the optical phase modulator 60 in the external cavity 48. Assumed is a 1 cm long external cavity 48 with a reflectance of −30 dB. In the presence of the optical phase modulator 60 (full grey line), the tuning is linear and mode hop free over a range of more than 12 GHz, while in the absence of the optical phase modulator 60 (full black line) the tuning is non-linear. The dotted line shows the phase delay that needs to be applied vs. the tuning.

It can also be shown that if the semiconductor laser 36 is chirped, then the externally reflected light entering the internal cavity of the laser 36 has a frequency than is different from the frequency of the light the laser is momentarily producing. This is due to the delay of the light in the external cavity 48. This effect will normally broaden the linewidth and cause power variations over time.

By modulating the optical phase modulator 60 at the right speed, one can avoid this problem as well. To this end, the phase has to be changed at a rate $2\pi \cdot r_{chirp} \cdot \tau_{ext}$ if the optical frequency f of the semiconductor laser 36 is changed at a fixed chirp rate $r_{chirp}$. Then the semiconductor laser 36 remains stable with a narrow linewidth, and the frequency of the light produced by the light source 16 varies at the desired rate $r_{chirp}$.

The invention claimed is:

1. A light source for a frequency-modulated continuous-wave (FMCW) LiDAR device, wherein the light source is formed by a photonic integrated circuit and comprises:

a substrate, a multilayer structure supported by the substrate, wherein at least the following functional elements are formed by the multilayer structure:

an input optical waveguide, an output optical waveguide and a cavity optical waveguide, an optical splitter connecting the input optical waveguide both to the output optical waveguide and to the cavity optical waveguide, a reflector connected to the cavity optical waveguide, and a variable attenuator causing an attenuation of light guided in the cavity optical waveguide, a semiconductor laser that is received in a recess etched into the multilayer structure and connected to the input optical waveguide such than an optical path extending between the semiconductor laser and the reflector and including the optical splitter forms an external cavity for the semiconductor laser, a first electrical line connected to the semiconductor laser so as to supply the semiconductor laser with a varying operating current, wherein the semiconductor laser is configured to produce light having a frequency that varies synchronously with the supplied operating current, a second electrical line connected to the variable attenuator so that the attenuation caused by the attenuator depends on electrical signals that are supplied to the variable attenuator via the second electrical line, and an electronic control module configured to supply the variable attenuator with electrical signals so that the variable attenuator causes a constant attenuation that is determined on a basis of measurements of the performance of the light source such that a linewidth of the semiconductor laser has a minimum.

2. The light source of claim 1, wherein the variable attenuator comprises a Mach- Zehnder interferometer comprising two arms, wherein one of the arms comprises a thermally tunable phase portion.

3. The light source of claim 1, comprising a variable optical phase modulator acting on the cavity optical waveguide.

4. The light source of claim 3, wherein the variable optical phase modulator is configured to change the phase of the light at a change rate that depends on a change rate of the frequency of the light produced by the semiconductor laser.

5. The light source of claim 3, wherein the variable optical phase modulator is thermally tunable.

6. The light source of claim 5, wherein the variable optical phase modulator comprises a heating portion being part of the cavity optical waveguide and an electrical waveguide heater adjacent the heating portion, wherein the electrical waveguide heater comprises an electrical conductive element configured to produce heat when exposed to an electrical heating current.

7. The light source of claim 6, comprising a third electrical line connected to the waveguide heater so as to provide a heating current to the waveguide heater.

8. The light source of claim 1, wherein the cavity optical waveguide has a length between 5 mm and 100 mm.

9. A frequency-modulated continuous-wave (FMCW) LiDAR device comprising the light source of claim 1.

10. The FMCW LiDAR device of claim 9, wherein the electronic control module is connected to the first electric line and the second electric line.

11. The FMCW LiDAR device of claim 10, wherein the electronic control module is configured to vary the operating current supplied to the semiconductor laser via the first electrical line such that a magnitude of the current linearly increases or decreases during periodic measuring intervals.

12. The FMCW LiDAR device of claim 10, wherein the light source comprises a variable optical phase modulator acting on the cavity optical waveguide, and wherein the electronic control module is configured to control the optical phase modulator so as to produce a phase delay varying between 0 and $2\pi\Delta f \cdot \tau_{ext}$, wherein $\Delta f$ is a frequency range within which the frequency of the light produced by the semiconductor laser varies, and wherein $\tau_{ext}$ is a cavity roundtrip time required for the light to pass the optical path between the semiconductor laser and the reflector and back from the reflector to the semiconductor laser.

* * * * *